United States Patent [19]

Yoshido

[11] Patent Number: 4,914,393
[45] Date of Patent: Apr. 3, 1990

[54] ACCURATELY INDICATING A STATUS OF CONSUMPTION OF A BATTERY BY WHICH AN ELECTRONIC CIRCUIT IS CONTROLLABLY PUT INTO OPERATION

[75] Inventor: Koichi Yoshido, Tokyo, Japan

[73] Assignee: NEC Corporation, Japan

[21] Appl. No.: 236,898

[22] Filed: Aug. 26, 1988

[30] Foreign Application Priority Data

Aug. 27, 1987 [JP] Japan ................................ 62-213884

[51] Int. Cl.$^4$ ............................................ G01N 27/46
[52] U.S. Cl. ...................................... 324/428; 320/48; 324/431; 340/636
[58] Field of Search ................ 324/426, 427, 428, 431; 320/48; 340/636

[56] References Cited

U.S. PATENT DOCUMENTS

| | | | |
|---|---|---|---|
| 3,778,702 | 12/1973 | Finger | 324/428 |
| 3,805,157 | 4/1974 | Acks et al. | 324/428 X |
| 3,895,284 | 7/1975 | Schweizer et al. | 324/428 X |
| 4,051,424 | 9/1977 | Privee | 324/428 X |
| 4,679,000 | 7/1987 | Clark | 324/428 |

Primary Examiner—Reinhard J. Eisenzopf
Assistant Examiner—Robert W. Mueller
Attorney, Agent, or Firm—Ostronlenk, Faber, Gerb & Soffen

[57] ABSTRACT

In an arrangement for use in an electronic circuit controllably put into operation by a battery and for indicating a consumption status of the battery, a measuring circuit measures a total time interval of operation of the electronic circuit. A processing circuit processes the total time interval into a calculated status for the battery. An indicator indicates the consumption status based on the calculated status. The processing circuit may comprise a memory for memorizing various current rates which are used in the electronic circuit and on which an arithmetic circuit calculates the calculated status. Alternatively, first and second measuring circuits may be used with first and second current rates memorized in the memory for the first and the second measuring circuits. Instead of the measuring circuits, a summing circuit may be supplied with a succession of the current rates repeatedly read out of the memory to sum up a total amount of current consumed by the electric circuit. As a further alternative, a counter counts down to obtain the total time interval in response to a pulse sequence of a pulse repetition period that is variable in proportion to a varying level of electric current supplied from the battery to the electronic circuit.

9 Claims, 5 Drawing Sheets

ACCURATELY INDICATING A STATUS OF CONSUMPTION OF A BATTERY BY WHICH AN ELECTRONIC CIRCUIT IS CONTROLLABLY PUT INTO OPERATION

BACKGROUND OF THE INVENTION

This invention relates to a battery-status-indicating arrangement for use in an electronic circuit.

An electronic circuit of the type described, is typically a radio communication apparatus of a radio pager receiver, a mobile radio telephone set, a mobile radio transceiver, or the like. The electronic circuit is controllably put into operation by a battery. More specifically, the electronic circuit is controllably put into operation by electric current supplied from the battery. The battery-status-indicating arrangement is for indicating a status of consumption of the battery.

A conventional battery-status-indicating arrangement comprises a voltmeter connected to a pair of terminals of the battery for measuring a voltage difference between the terminals and for indicating the voltage difference as the status of consumption of the battery. In general, the battery has not a linear characteristic of a voltage decrease relative to a total amount of the electric current which the electronic circuit consumes. The total amount of the electric current consumed by the electronic circuit is equivalent in meaning to a consumed quantity of energy which the electronic circuit consumes as the electric current. Therefore, the conventional battery status indicating arrangement is deficient in that it is difficult for a user of the electronic circuit to judge with reference to a voltmeter indication how long the electronic circuit can further be put into operation by the battery.

SUMMARY OF THE INVENTION

It is therefore an object of the present invention to provide a battery-status-indicating arrangement which is for use in an electronic circuit controllably put into operation by a battery and which is capable of accurately indicating a status of consumption of the battery.

It is another object of this invention to provide a battery-status-indicating arrangement of the type described, which is suitable for indicating how long the electronic circuit can further be put into operation by the battery.

Other objects of this invention will become clear as the description proceeds.

On describing the gist of this invention, it will be possible to understand that a battery-status-indicating arrangement is for use in an electronic circuit that is controllably put into operation by a battery. The battery status indicating arrangement is for indicating a status of consumption of the battery.

According to an aspect of this invention, the battery status indicating arrangement comprises: (1) measuring means coupled to the electronic circuit for measuring a total time interval during which the electronic circuit is put into operation, the measuring means thereby producing a time-duration signal indicative of the total time interval; (2) processing means responsive to the time duration signal for processing the total time interval into a calculated status for the battery to produce a status signal representative of the calculated status; and (3) indicating means responsive to the status signal for indicating the status of consumption based on the calculated status.

According to another aspect of this invention, the battery-status-indicating arrangement comprises: (1) memory means for memorizing a current-rate signal representative of a current rate at which the electronic circuit is controllably put into operation; (2) current-rate processing means responsive to the current-rate signal for processing the current rate into a calculated status for the battery to produce a status signal representative of the calculated status; and (3) indicating means responsive to the status signal for indicating the status of consumption based on the calculated status.

BRIEF DESCRIPTION OF THE DRAWING

Other features and advantages of the present invention will become apparent from the following description of the invention which refers to the accompanying drawings, in which.

DESCRIPTION OF THE PREFERRED EMBODIMENTS

Figure 1:
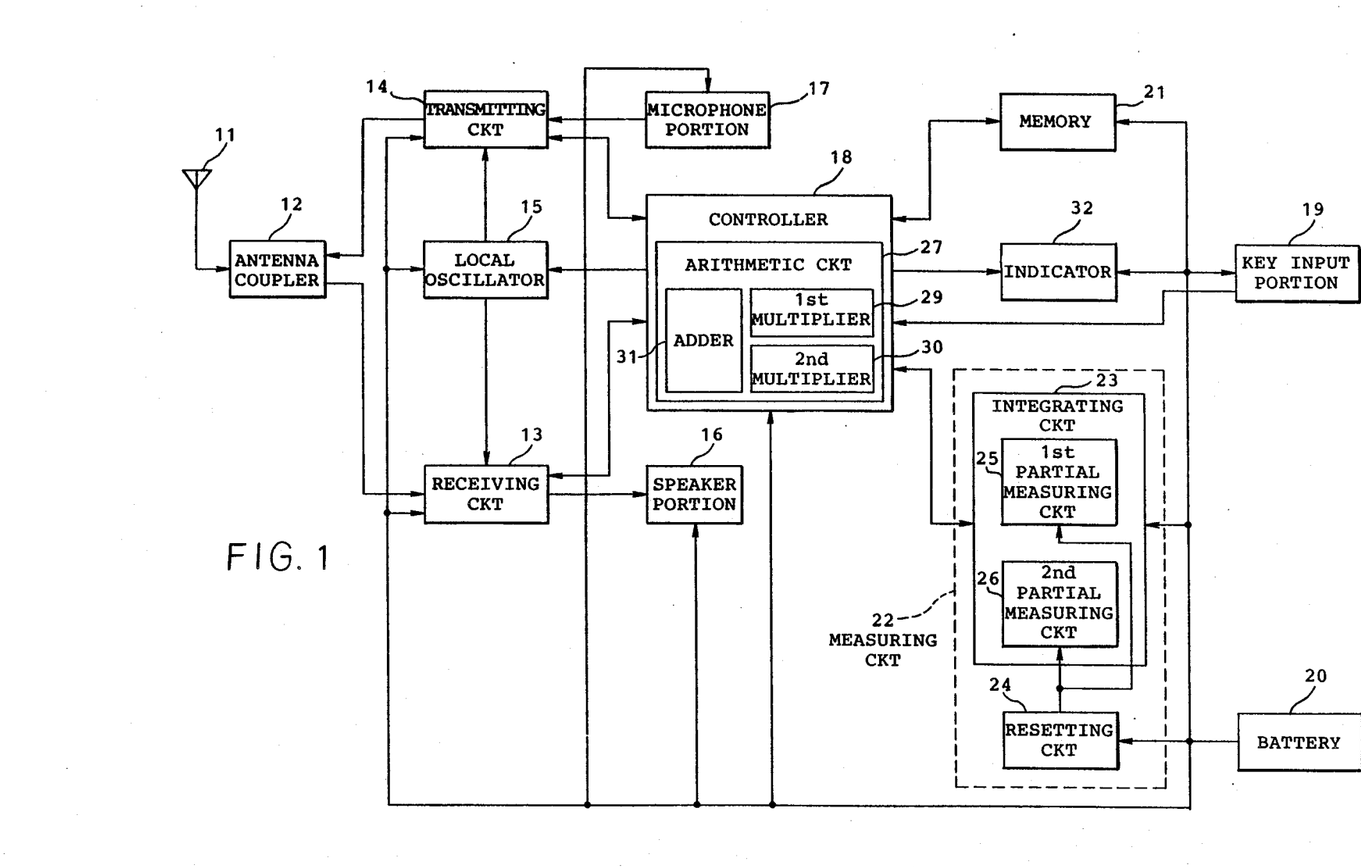
FIG. 1 is a block diagram of a mobile radio telephone set that comprises a battery-status-indicating arrangement according to a first embodiment of this invention.

Referring to FIG. 1, a battery-status-indicating arrangement according to a first embodiment of this invention is for use in an electronic circuit which is a mobile radio telephone set in the example being illustrated. The mobile radio telephone set comprises an antenna 11, an antenna coupler 12, a receiving circuit 13, a transmitting circuit 14, a local oscillator 15, a speaker portion 16, a microphone portion 17, a controller 18, and a manually-operable key-input portion 19. When put into the mobile radio telephone set, a battery 20 becomes capable of supplying electric current to the receiving circuit 13, the transmitting circuit 14, the local oscillator 15, the speaker portion 16, the microphone portion 17, the controller 18, and the key-input portion 19.

The mobile radio telephone set is controllably put into operation by the key-input portion 19. More specifically, the mobile radio telephone set is controllably put into a waiting or first mode of operation when the key-input portion 19 is manipulated. On carrying out communication, the mobile radio telephone set is automatically turned into a communication or second mode of operation. The waiting and the communication modes of the mobile radio telephone set will now be described.

The mobile radio telephone set is usually put into the waiting mode of operation under the control of the controller 18. At the waiting mode, the controller 18 drives the receiving circuit 13 and the local oscillator 15 to put each of the receiving circuit 13 and the local oscillator 15 into an operation state. In this event, the local oscillator 15 supplies the receiving circuit 13 with a frequency signal which specifies a control channel. That is, the receiving circuit 13 can receive, through the antenna 11 and the antenna coupler 12, an incoming signal which is sent through the control channel by a fixed or base station.

Responsive to the incoming signal, the receiving circuit 13 delivers the incoming signal to the controller 18. When the controller 18 receives the incoming signal, the controller 18 judges whether or not the incoming signal is a call signal specific to the mobile radio telephone set. Only when the incoming signal is the call signal specific to the mobile radio telephone set, the controller 18 drives not only the receiving circuit 13 and the local oscillator 15 but also the transmitting circuit 14 to put each of the receiving circuit 13, the local oscillator 15, and the transmitting circuit 14 into an operation state. In this event, the local oscillator 15 supplies the receiving circuit 13 and the transmitting circuit 14 with another frequency signal which specifies one of communication or speech channels. As a result, the mobile radio telephone set is put into the communication mode of operation in which the mobile radio telephone set can transmit and receive a communication signal to and from the fixed station through the above-mentioned one of the communication channels by the use of the microphone and the speaker portions 17 and 16. As is known in the art, the controller 18 also drives a tone generator (not shown) to make the tone generator generate a call tone when the controller 18 judges that the incoming signal is the call signal specific to the mobile radio telephone set.

The mobile radio telephone set can also be put into the communication mode of operation when the key-input portion 19 is manually operated by a user of the mobile radio telephone set in order to start communication with the fixed station. When the key-input portion 19 is operated so as to start communication with the fixed station, the key-input portion 19 generates a communication start signal. Responsive to the communication start signal, the controller 18 drives the transmitting circuit 14 in addition to the receiving circuit 13 and the local oscillator 15 in a similar manner described above.

At any rate, the transmitting circuit 14 is not put into the operation state at the waiting mode of operation but put into the operation state in the communication mode of operation. The mobile radio telephone set consumes a first quantity of electricity in the waiting mode and a second quantity of electricity in the communication mode. The first quantity is less than the second quantity. The first quantity of electricity per unit time will be referred to as a first current-rate while the second quantity of electricity per unit time will be referred to as a second current-rate. The first and the second current rates are, for example, two hundred milliamperes and two amperes, respectively.

The battery status indicating arrangement is for indicating a status of consumption of the battery 20 and comprises a memory 21 for memorizing first and second current-rate signals representative of the first and the second current rates at which the mobile radio telephone set is controllably put into the waiting and the communication operation modes, respectively. Summarizing, the memory 21 memorizes a current-rate signal representative of a current rate at which the mobile radio telephone set is controllably put into operation.

The battery-status-indicating arrangement further comprises a measuring circuit 22 coupled to the mobile radio telephone set for measuring a total time interval during which the mobile radio telephone set is put into operation. The measuring circuit 22 thereby produces a time duration signal indicative of the total time interval. More specifically, the measuring circuit 22 comprises an integrating circuit 23 coupled to the mobile radio telephone set for integrating or summing the total time interval to produce a time-duration signal and a resetting circuit 24 connected to the integrating circuit 23 for resetting the time-duration signal to an initial duration signal indicative of zero as the total time interval when the battery 20 is detached from the mobile radio telephone set.

Alternatively, such a resetting operation for the integrating circuit 23 may be carried out by a manual operation of a user of the mobile radio telephone set when a new battery is attached to the mobile radio telephone set as the battery 20 instead of an old battery. For this purpose, the key-input portion 19 produces a resetting signal when the key-input portion 19 is manually operated by the user in order to carry out the resetting operation for the integrating circuit 23. Responsive to the resetting signal, the controller 18 carries out the resetting operation for the integrating circuit 23 instead of the resetting circuit 24.

The integrating circuit 23 of the measuring circuit 22 comprises first and second partial-measuring circuits 25 and 26. Being coupled to the mobile radio telephone set, the first partial-measuring circuit 25 measures a first total time interval during which the mobile radio telephone set is put into the waiting or first mode of operation. The first partial-measuring circuit 25 thereby produces a first time-duration signal indicative of the first total time interval. Likewise, the second partial-measuring circuit 26 is coupled to the mobile radio telephone set and measures a second total time interval during which the mobile radio telephone set is put into the communication or second mode of operation. The second partial-measuring circuit 26 thereby produces a second time-duration signal indicative of the second total time interval. Each of the first and the second partial-measuring circuits 25 and 26 may be a timer known in the art.

Coupled to the memory 21 and to the measuring circuit 22, an arithmetic circuit 27 multiplies the current-rate signal and the time-duration signal to produce a multiplied signal representative of a product of the current rate and the total time interval. The multiplied signal is used as a status signal representative of a calculated status for the battery 20.

More specifically, the arithmetic circuit 27 comprises first and second multipliers 29 and 30 and an adder 31. Coupled to the memory 21 and to the first partial measuring circuit 25, the first multiplier 29 multiplies the first current rate signal and the first time duration signal. The first multiplier 29 thereby produces a first multiplied signal representative of a first product of the first current rate and the first total time interval.

Likewise, the second multiplier 30 is coupled to the memory 21 and to the second partial-measuring circuit 26 for multiplying the second current rate signal and the second time-duration signal. The second multiplier 30 thereby produces a second multiplied signal representative of a second product of the second current rate and the second total time interval.

The adder 31 is coupled to the first and the second multipliers 29 and 30. The adder 31 adds the first and the second multiplied signals to make the status signal represent a sum of the first and the second products.

Thus, a combination of the memory 21 and the arithmetic circuit 27 serves as a processing circuit coupled to the measuring circuit 22. Responsive to the time-duration signal supplied from the measuring circuit 22, the processing circuit processes the total time interval into the calculated status for the battery 20 to produce the status signal representative of the calculated status.

Responsive to the status signal, an indicator 32 of, for example, a visual display unit indicates the status of consumption based on the calculated status. The indicator 32 indicates, by the use of a bar graph, for example the sum of the first and the second products as a consumed quantity of electricity which the mobile radio telephone set has consumed up to the present time. In the bar graph, a bar is displayed to have a short bar length when the consumed quantity of electricity is great. Therefore, the bar has a maximum bar length when a new battery is attached to the mobile radio telephone set instead of the battery 20 illustrated in FIG. 1. It is preferred to make the indicator 32 further indicate a using-limit mark indicative of a using limit of the battery 20.

A value of percentage of the consumed quantity of electricity to maximum quantity of electricity of the battery 20 may be indicated instead of the bar graph. Alternatively, indication may be made as regards another percentage value of a remaining amount of energy convertible to electricity with respect to the maximum amount of the energy. The indicator 32 may indicate how long the mobile radio telephone set can further be put into operation by the battery 20. More specifically, the indicator 32 may indicate how long the mobile radio telephone set is put into either the waiting operation mode or the communication operation mode by the battery 20.

It may be apparent that the electric current is supplied from the battery 20 to the memory 21, the integrating circuit 23, the resetting circuit 24, the arithmetic circuit 27, and the indicator 32 when the battery 20 is attached to the mobile radio telephone set.

Figure 2:
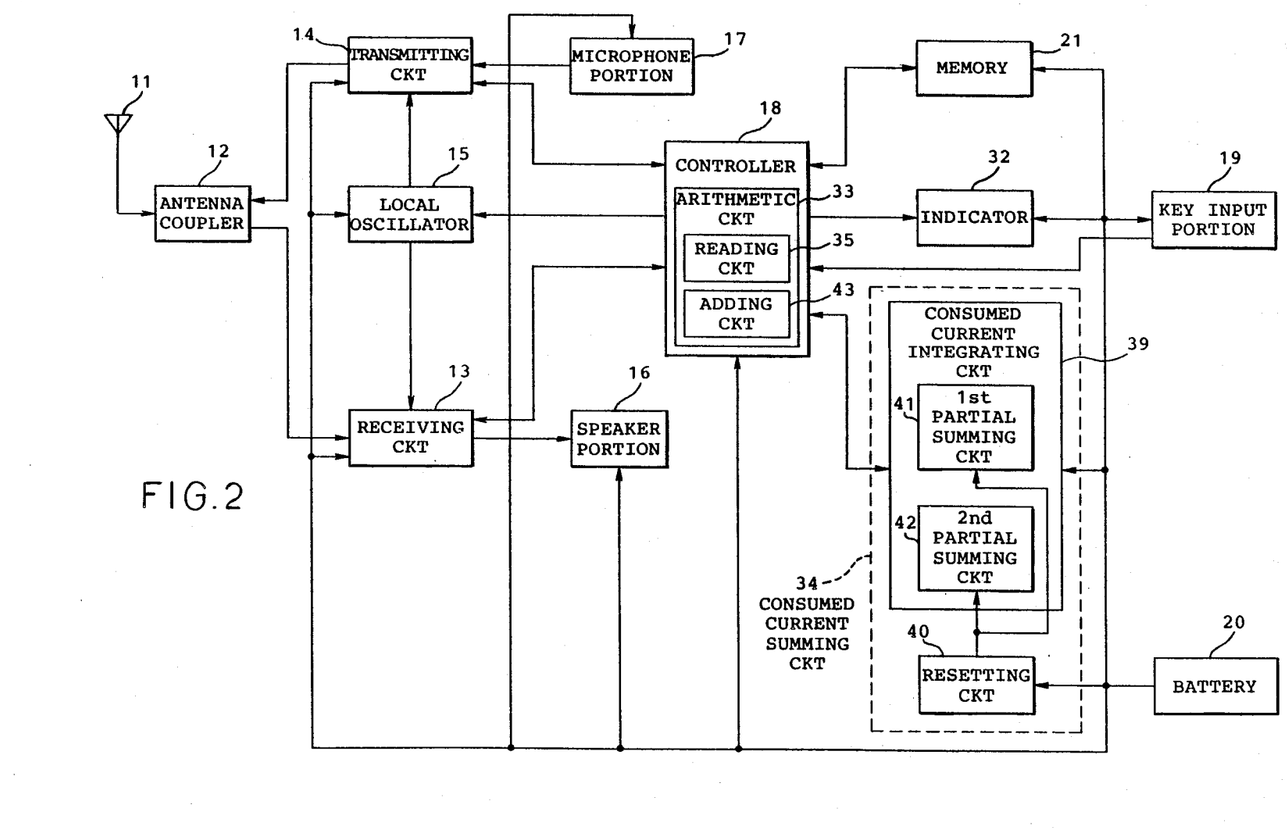
FIG. 2 is a block, diagram of another mobile radio telephone set that comprises a battery-status-indicating arrangement according to a second embodiment of this invention.

Referring to FIG. 2, a battery-status-indicating arrangement according to a second embodiment of this invention is also for use in the mobile radio telephone set. The battery-status-indicating arrangement is similar to the battery-status-indicating arrangement illustrated in FIG. 1 except that a different arithmetic circuit 33 is included in the controller 18 instead of the arithmetic circuit 27 illustrated in FIG. 1 and that a consumed-current summing circuit 34 is coupled to the arithmetic circuit 33 instead of the measuring circuit 22.

The arithmetic circuit 33 comprises a reading circuit 35 coupled to the memory 21 for periodically reading the current-rate signal out of the memory 21 at a predetermined time interval of, for example, a unit time while the mobile radio telephone set is controllably put into operation. The reading circuit 35 thereby produces a read-out signal having a form of a succession of the current-rate signals. The unit time is, for example, one second.

In this event, the reading circuit 35 periodically reads the first current-rate signal out of the memory 21 at the predetermined time interval while the mobile radio telephone set is controllably put into the waiting or the first mode of operation. The reading circuit 35 thereby produces a first read-out signal having a form of a succession of the first current signals. While the mobile radio telephone set is controllably put into the communication of the second mode of operation, the reading circuit 35 periodically reads the second current rate signal out of the memory 21 at the predetermined time interval to thereby produce a second read-out signal having another succession of the second current-rate signals.

The consumed-current summing circuit 34 comprises a consumed-current integrating circuit 39 responsive to the read-out signal for summing up the current rates to produce a sum signal representative of a sum of the current rates. Connected to the consumed-current integrating circuit 39, a resetting circuit 40 is for resetting the sum signal to an initial signal indicative of zero.

More specifically, the consumed-current integrating circuit 39 of the consumed-current summing circuit 34 comprises first and second partial-summing circuits 41 and 42. The first partial-summing circuit 41 sums up the first current rates in response to the first read-out signal to produce a first sum signal representative of a first sum of the first current rates. Likewise, the second partial-summing circuit 42 sums up the second current rates in response to the second read-out signal to produce a second sum signal representative of a second sum of the second current rates. Each of the first and the second partial-summing circuits 41 and 42 may be an up-counter known in the art.

Coupled to the first and the second partial-summing circuits 41 and 42, an adding circuit 43 adds the first and the second sum signals to make the status signal represent a total sum of the first and the second sums. In other words, the adding circuit 43 is operable as a supplying circuit responsive to the sum signal for supplying the sum signal to the indicator 32 as the status signal.

Thus, a combination of arithmetic circuit 33 and the consumed-current summing circuit 34 serves as a current-rate processing circuit responsive to the current-rate signal for processing the current rate into a calculated status for the battery 20 to produce a status signal representative of the calculated status.

Figure 3:
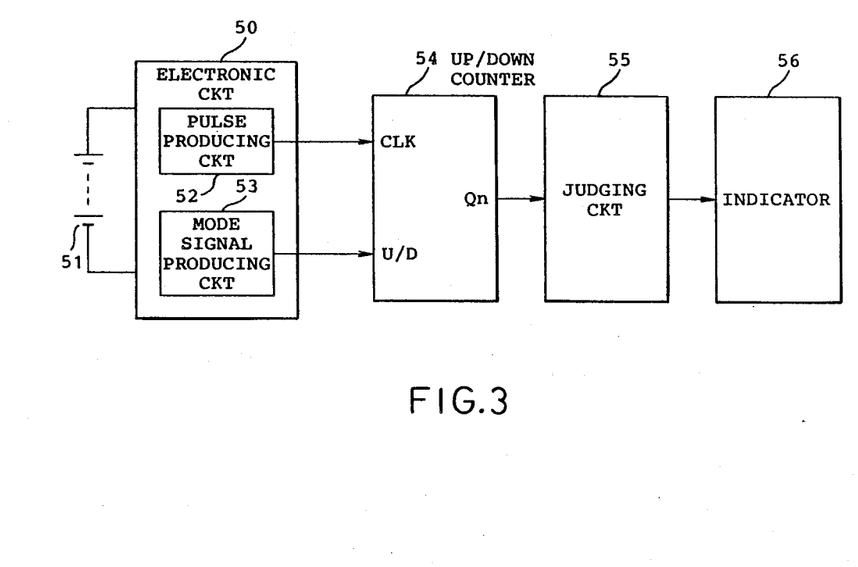
FIG. 3 is a block diagram of an electronic circuit which comprises a battery-status-indicating arrangement according to a third embodiment of this invention.

Referring to FIG. 3, a battery-status-indicating arrangement according to a third embodiment of this invention is for use in another electronic circuit 50. The electronic circuit 50 is controllably put into operation by electric current supplied from a battery 51 with a varying level. The battery 51 is a secondary battery such as a nickel-cadmium battery.

The battery-status-indicating arrangement is for indicating a status of consumption of the battery 51 and comprises a pulse-producing circuit 52 coupled to the electronic circuit 50. Responsive to the electric current, the pulse-producing circuit 52 produces a pulse sequence of a pulse repetition period which decreases in proportion to the varying level. It will be assumed that the pulse-producing circuit 52 produces ten pulses per T seconds when the electric current has a level of one ampere, where T represents a positive integer. In this case, the pulse repetition period is equal to T/10. When the electric current has a level of 1/10 amperes, the pulse repetition period is equal to T.

Coupled to the electronic circuit 50, a mode signal-producing circuit 53 produces a discharge mode signal of a logic "0" level when the electronic circuit 50 is put into operation. When the electronic circuit 50 is put into operation, the battery 51 is put into a discharge mode at which the battery 51 supplies the electric current to the electronic circuit 50. When the battery 51 is put into a charge mode at which the battery 51 is subjected to a charge operation, the mode signal producing circuit 53 produces a charge mode signal of a logic "1" level. The battery 51 is put into the charge mode by a user of the electronic circuit 50 when the electronic circuit 50 is not put into operation.

An up/down counter 54 is coupled to the pulse-producing circuit 52 and to the mode signal-producing circuit 53. On reception of the charge mode signal, the up/down counter 54 is operable as an up-counter in a manner that will presently be described. On reception of the discharge mode signal, the up/down counter 54 is operable as a down-counter in the manner that will also presently be described.

The up/down counter 54 has a clock input terminal labelled "CLK", a signal-input terminal labelled "U/D", and an output terminal labelled "Qn". The clock and the signal-input terminals are connected to the pulse and the mode signal-producing circuits 52 and 53, respectively.

It will be assumed that the up/down counter 54 has a particular count when the battery 51 is put into the charge mode by the user of the electronic circuit 50. In this case, the up/down counter 54 is supplied with the charge mode signal and the pulse sequence to the signal input terminal U/D and the clock input terminal CLK, respectively. As a result, the up/down counter 54 counts up the particular count to an increased count in response to the pulse sequence and gives the output terminal a counted up signal representative of the increased count. When the charge operation of the battery 51 comes to an end, the increased count indicates a maximum count.

When the battery 51 is put into the discharge mode, the up/down counter 54 is supplied with the discharge mode signal and the pulse sequence to the signal input terminal U/D and the clock input terminal CLK, respectively. The maximum count serves as an initial count. The up/down counter 54 counts down from the maximum count to a reduced count in response to the pulse sequence and supplies the output terminal with a counted-down signal representative of the reduced count. Each of the counted up signal and the counted-down signal will be referred to simply as a count signal.

It should be understood that a combination of the pulse-producing circuit 52 and the up/down counter 54, when put into the discharge mode, serves as a measuring circuit coupled to the electronic circuit 50. The measuring circuit measures a total time interval during which the electronic circuit 50 is put into operation, namely, the discharge mode of the battery 51. The total time interval is specified by the reduced count of the up/down counter 54. The measuring circuit thereby produces a time-duration signal indicative of the total time interval. The up/down counter 54 produces the count signal as the time-duration signal.

A judging circuit 55 is coupled to the up/down counter 54 and is given a plurality of reference signals representative of reference counts, respectively, which will presently become clear. Responsive to the count signal, the judging circuit 55 judges whether or not the increased count reaches any one of the reference counts to produce a status signal representative of this one of the reference counts. Likewise, the judging circuit 55 judges whether or not the reduced count reaches any one of the reference counts to produce the status signal.

Thus, the judging circuit 55 serves as a processing circuit. Responsive to the time-duration signal, namely, the count signal, the processing circuit processes the total time interval, namely, the reduced count, into a calculated status for the battery 51 to produce a status signal representative of the calculated status.

Responsive to the status signal, an indicator 56 indicates a percentage value of a remaining amount of energy of the battery 51 with respect to a maximum amount of the energy. The maximum amount of the energy corresponds to the maximum count which is obtained by the up/down counter 54 when the charge operation of the battery 51 comes to an end. The remaining amount corresponds to one of the reference counts that either the increased count or the reduced count reaches. Thus, the indicator 56 indicates, in response to the status signal, the status of consumption based on the calculated status like the indicator 32 illustrated in FIG. 1.

Figure 4:
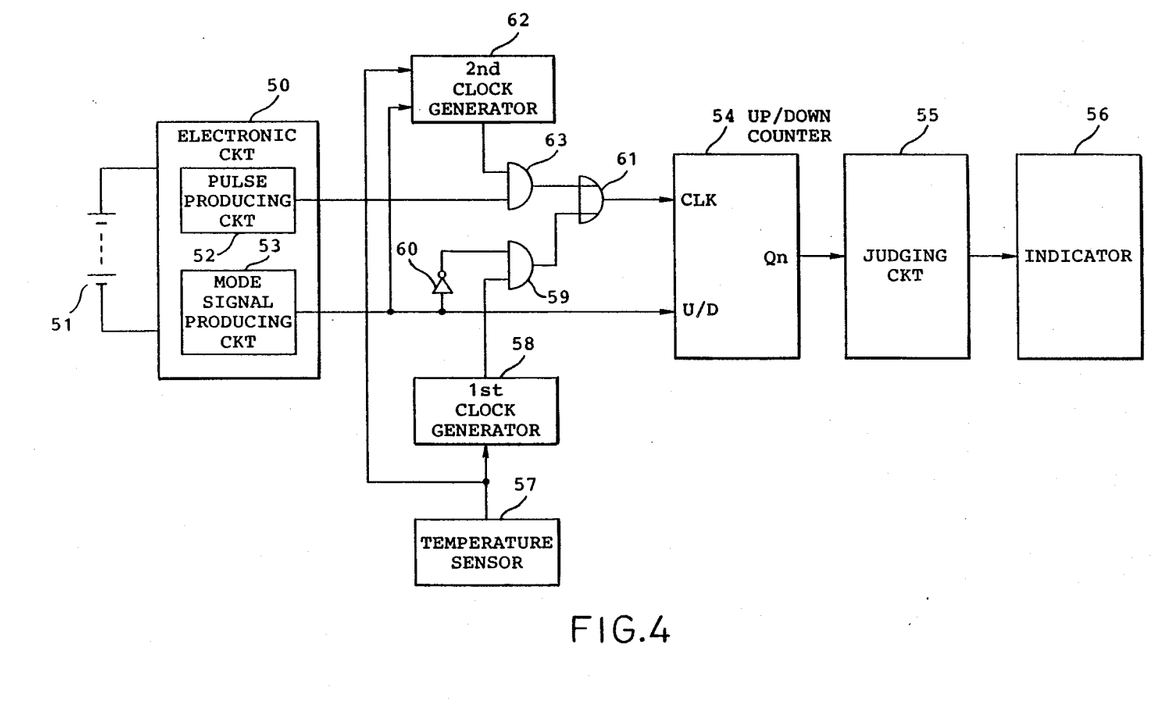
FIG. 4 is a block diagram of another electronic circuit which comprises a battery-status-indicating arrangement according to a fourth embodiment of this invention.

Referring to FIG. 4, a battery-status-indicating arrangement according to a fourth embodiment of this invention is also for use in the electronic circuit 50. The battery-status-indicating arrangement comprises similar parts designated by like reference numerals. The battery-status-indicating arrangement further comprises first and second compensating circuits which will be described below.

Description will be first made as regards the first compensating circuit. When the electronic circuit 50 is put into operation, the battery 51 is put into the discharge mode at which the battery 51 supplies electric current to the electronic circuit 50 as mentioned above. However, energy of the battery 51 can not entirely be used as the electric current supplied to the electronic circuit 50. Actually, a part of energy of the battery 51 is inevitably lost as a self-discharge component when the battery 51 is put into the discharge mode. Moreover, the self-discharge component changes in accordance with an ambient temperature of the battery 51. The self-discharge component becomes large as the ambient temperature becomes high.

The first compensating circuit is for compensating for such a change of the self-discharge component. The first compensating circuit comprises a temperature sensor 57 for detecting the ambient temperature to produce a detection signal.

Responsive to the detection signal, a first clock generator 58 produces a first clock pules sequence of a pulse repetition period which increases in proportion to the ambient temperature. Each pulse of the first clock pulse sequence has a pulse width substantially equal to that of each pulse of the pulse sequence produced by the pulse-producing circuit 52. The pulse repetition period of the first clock pulse sequence is considerably longer than the pulse repetition period of the pulse sequence produced by the pulse-producing circuit 52. This is because the self-discharge component is much less than that energy of the battery 51 which is used as the electric current supplied to the electronic circuit 50. The first clock generator 58 is of, for example, an oscillator having a capacitor and a resistor.

A first AND circuit 59 is coupled to the first clock generator 58 directly and the mode signal-producing circuit 53 through an inverter circuit 60. Responsive to the first clock pulse sequence and the discharge mode signal of a logic "0" level, the first AND circuit 59 carries out an AND operation of the first clock pulse sequence and an inverted signal of the discharge mode signal to produce a first AND signal. The first AND signal is supplied to the clock input terminal CLK of the up/down counter 54 through an OR circuit 61.

Thus, the first compensating circuit compensates for the change of the self-discharge component of the battery 51.

Description will proceed to the second compensating circuit. The second compensating circuit is for compensating for a change of a capacity of the battery 51.

Figure 5:
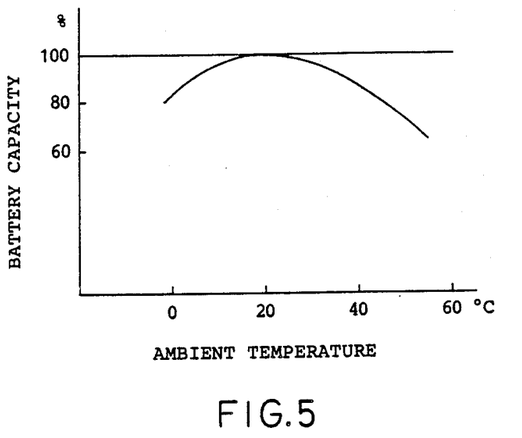
FIG. 5 shows a graphical representation for use in describing operation of the battery-status-indicating arrangement of the electronic circuit illustrated in FIG. 4.

Turning to FIG. 5, description will be made as regards the change of such a battery capacity. The battery capacity changes depending on the ambient temperature. The battery capacity becomes maximum when the ambient temperature is twenty degrees Celsius. The battery capacity decreases as the ambient temperature becomes lower or higher than twenty degrees.

Turning back to FIG. 4, a second clock generator 62 is coupled to the temperature sensor 57 and to the mode signal-producing circuit 53. Responsive to the detection signal and either the charge mode signal or the discharge mode signal, the second clock generator 62 produces a second clock pulse sequence of a predetermined pulse repetition period. The predetermined pulse repetition period of the second clock pulse sequence is selected so as to become considerably longer than the pulse repetition period of the pulse sequence produced by the pulse producing circuit 52. Each pulse of the second clock pulse sequence has a pulse width that varies in accordance with the ambient temperature and in dependency upon reception of either the charge mode signal or the discharge mode signal in a manner that will be described below.

Figure 6:
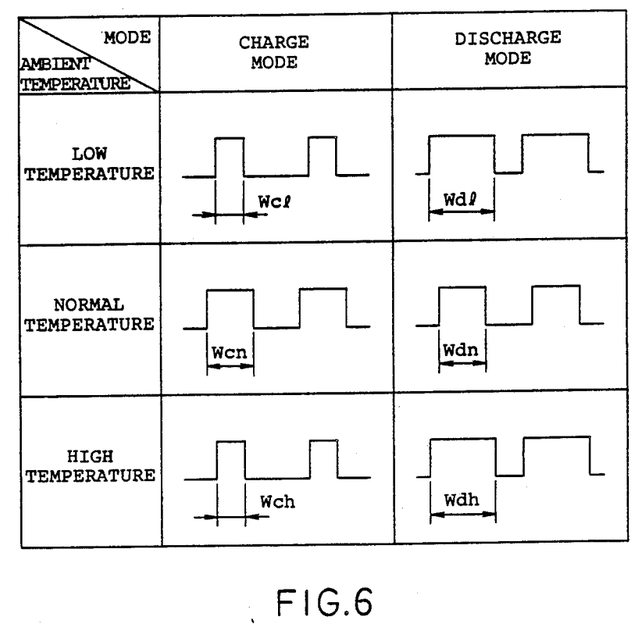
FIG. 6 is a diagram for use in describing another operation of the battery-status-indicating arrangement of the electronic circuit illustrated in FIG. 4.

Turning to FIG. 6, description will proceed to the pulse width of each pulse of the second clock pulse sequence. Description will be made at first about a case where the battery 51 (FIG. 4) is put into the charge mode. When the ambient temperature is a low temperature below a normal temperature, each pulse of the second clock pulse sequence has a pulse width Wcl as depicted along a top line. As depicted along a middle line, each pulse of the second clock pulse sequence has a pulse width Wcn when the ambient temperature is normal temperature. When the ambient is a high temperature higher than normal temperature, each pulse of the second clock pulse sequence has a pulse width Wch as depicted along a bottom line.

Each of the pulse widths Wcl and Wch is shorter than the pulse width Wcn. The pulse widths Wcl, Wcn, and Wch are controlled by the detection signal produced by the temperature sensor 57 (FIG. 4).

When the ambient temperature changes from normal temperature to the high temperature when the battery 51 is subjected to the charge operation, the battery capacity decreases as mentioned above. This is equivalent to a decrease of the amount of electric current to be stored in the battery 51 as chemical energy.

Description will proceed to another case where the battery 51 is put into the discharge mode. When the ambient temperature is the low temperature, each pulse of the second clock pulse sequence has a pulse width Wdl as depicted along a top line. As depicted along a middle line, each pulse of the second clock pulse sequence has a pulse width Wdn when the ambient is normal temperature. When the ambient temperature becomes equal to a high temperature, each pulse of the second clock pulse sequence has a pulse width Wdh as depicted along a bottom line.

Each of the pulse widths Wdl and Wdh is longer than the pulse width Wdn. The pulse widths Wdl, Wdn, and Wdh are controlled by the detection signal produced by the temperature sensor 57. The pulse width Wdn is substantially equal to the pulse width Wcn.

Turning back to FIG. 4, a second AND circuit 63 is coupled to the second clock generator 62 and to the pulse-producing circuit 52. Responsive to the second clock pulse sequence and the pulse sequence produced by the pulse-producing circuit 52, the second AND circuit 63 carries out an AND operation of the second clock pulse sequence and the pulse sequence produced by the pulse-producing circuit 52. The AND circuit 63 thereby produces a second AND signal.

Responsive to the second AND signal and to the first AND signal produced by the first AND circuit 59, the OR circuit 61 carries out an OR operation of the first and the second AND signals to produce an OR signal. The OR signal is supplied to the clock input terminal CLK of the up/down counter 54.

Thus, the second compensating circuit compensates for the change of the capacity of the battery 51 in accordance with the ambient temperature.

While this invention has thus far been described in conjunction with several embodiments thereof, it will readily be possible for those skilled in the art to put this invention into practice in various other manners. For example, this invention is applicable to a radio pager receiver which is controllably put into a waiting mode of operation by a battery. This invention is further applicable to a mobile radio telephone set which is controllably put into a plurality of transmission modes of operation. At each of the transmission modes, the mobile radio telephone set needs different electric power or energy to transmit a transmission signal. At any rate, the scope of this invention is unrestricted by the number of modes of operation of the electric circuit. Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A battery-status-indicating arrangement for use in an electronic circuit that is controllably put into operation by a battery, said battery-status-indicating arrangement being for indicating a status of consumption of said battery, wherein the improvement comprises, in combination with the foregoing;

measuring means coupled to said electronic circuit for measuring a total time interval during which said electronic circuit is put into operation, said measuring means thereby producing a time-duration signal indicative of said total time interval;

memory means for preliminarily memorizing a current-rate signal representative of a current rate at which said electronic circuit is controllably put into operation;

arithmetic means coupled to said memory means and to said measuring means for multiplying said current-rate signal and said time-duration signal to produce a multiplied signal representative of a product of said current rate and said total time interval as a status signal representative of a calculated status for said battery; and indicating means responsive to said status signal for indicating said status of consumption based on said calculated status.

2. A battery status indicting arrangement as claimed in claim 1, wherein said measuring means comprises:

integrating means coupled to said electronic circuit for measuring said total time interval to produce said time duration signal; and resetting means connected to said integrating means for resetting said time duration signal to an initial duration signal indicative of zero as said total time interval.

3. A battery-status-indicating arrangement as claimed in claim 1, said electronic circuit being controllably put into a first and a second mode of operation by said battery, wherein:

said memory means is for preliminarily memorizing a first and a second current-rate signal respectively representative of a first and a second current rate at which said electronic circuit is controllably put into said first and said second modes, respectively;

said measuring means comprising:

first partial-measuring means coupled to said electronic circuit for measuring a first total time interval during which said electronic circuit is put into said first mode, said first partial-measuring means thereby producing a first time-duration signal indicative of said first total time interval; and second partial-measuring means coupled to said electronic circuit for measuring a second total time interval during which said electronic circuit is put into said second mode, said second partial-measuring means thereby producing a second time-duration signal indicative of said second total time interval;

said arithmetic means comprising:

first multiplying means coupled to said memory means for multiplying said first current-rate signal and said first time-duration signal to produce a first multiplied signal representative of a first product of said first current rate and said first total time interval;

second multiplying means coupled to said memory means for multiplying said second current-rate signal and said second time-duration signal to produce a second multiplied signal representative of a second product of said second current rate and said second total time interval; and adding means coupled to said first and said second multiplying means for adding said first multiplied signal and said second multiplied signal together to make said status signal represent a sum of said first and said second products.

4. A battery-status-indicating arrangement for use in an electronic circuit which is controllably put into operation by a battery, said battery-status-indicating arrangement being for indicating a status of consumption of said battery, wherein the improvement comprises, in combination with the foregoing:

memory means for preliminarily memorizing a current-rate signal representative of a current rate at which said electronic circuit is controllably put into operation;

reading means for periodically reading said current-rate signal out of said memory means at a predetermined time interval while said electronic circuit is controllably put into operation, said reading means thereby producing a readout signal having a form of a succession of said current-rate signals;

summing means responsive to said read-out signal for summing up said current rates to produce a sum signal representative of a sum of said current rates as a status signal representative of a calculated status for said battery; and indicating means responsive to said status signal for indicating said status of consumption based on said calculated status.

5. A battery status indicating arrangement as claimed in claim 4, wherein said summing means comprises:

integrating means responsive to said read-out signal for summing up said current rates to produce said sum signal; and resetting means connected to said integrating means for resetting said sum signal to an initial signal indicative of zero.

6. A battery-status-indicating arrangement as claimed in claim 4, said electronic circuit being controllably put into a first and a second mode of operation by said battery, wherein:

said memory means is for preliminarily memorizing a first and a second current-rate signal respectively representative of a first and a second current rate at which said electronic circuit is controllably put into said first and said second modes, respectively;

said reading means being for periodically reading said first and said second current-rate signals out of said memory means at said predetermined time interval while said electronic circuit is controllably put into said first and second modes, respectively, said reading mean thereby producing a first read-out signal having a first form of a succession of said first current-rate signals and a second read-out signal having a second form of another succession of said second current-rate signals, respectively;

said summing means comprising:

first partial-summing means responsive to said first read-out signal for summing said first current rates to produce a first sum signal representative of a first sum of said first current rates; and second partial-summing means responsive to said second read-out signal for summing said second current rates to produce a second sum signal representative of a second sum of said second current rates;

said battery-status-indicating arrangement further comprising current-rate adding means coupled to said first and said second partial-summing means for adding said first and said second sum signals together to make said status signal represent a total sum of said first and said second sums.

7. A battery-status-indicating arrangement for use in an electronic circuit that is controllably put into operation by electronic current supplied from a battery at a varying level, said battery-status-indicating arrangement being for indicating a status of consumption of said battery, wherein the improvement comprises, in combination with the foregoing:

pulse-producing means coupled to said electronic circuit and responsive to said electric current for producing a basic pulse sequence of a pulse-repetition period that changes in proportion to said varying level;

temperature-detecting means for detecting an ambient temperature of said battery for producing a detection signal representative of said ambient temperature;

first clock generating means responsive to said detection signal for generating a first clock pulse sequence of a pulse repetition period that increases in proportion to said ambient temperature, each pulse of said first clock-pulse sequence having a pulse width substantially equal to that of each pulse of said basic pulse sequence, the pulse repetition period of said first clock pulse sequence being longer than the pulse repetition period of said basic pulse sequence;

pulse processing means for processing said basic pulse sequence and said first clock pulse sequence into a processed pulse sequence;

counting means coupled to said pulse processing means and given an initial count for counting down said initial count to a reduced count in response to said processed pulse sequence to produce a count signal representative of said reduced count; and indicating means responsive to said count signal for indicating said status of consumption.

8. A battery-status-indicating arrangement as claimed in claim 7, wherein said pulse processing means comprises OR operation means responsive to both said basic pulse sequence and said first clock pulse sequence for carrying out an OR operation of said basic clock pulse sequence and said first clock pulse sequence to produce an OR'ed pulse sequence as said processed pulse sequence.

9. A battery-status-indicating arrangement as claimed in claim 7, wherein:

said battery-status-indicating arrangement further comprises second clock generating means responsive to said detection signal for generating a second clock pulse sequence of a predetermined pulse repetition period that is longer than the pulse repetition period of said basic pulse sequence, each pulse of said second clock pulse sequence having a pulse width that increases in proportion to an absolute value of a difference between said ambient temperature and a reference temperature;

said pulse processing means comprising:

AND operation means responsive to said basic pulse sequence and said second clock pulse sequence for carrying out an AND operation of said basic pulse sequence and said second clock pulse sequence to produce an AND'ed pulse sequence; and OR operation means responsive to said AND'ed signal and said first clock pulse sequence for carrying out an OR operation of said AND'ed pulse sequence and said first clock pulse sequence to produce an OR'ed pulse sequence as said processed pulse sequence.

* * * * *